(12) United States Patent
Han

(10) Patent No.: US 11,837,687 B2
(45) Date of Patent: Dec. 5, 2023

(54) DISPLAY PANEL AND DISPLAY APPARATUS

(71) Applicant: BOE Technology Group Co., Ltd., Beijing (CN)

(72) Inventor: Long Han, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 576 days.

(21) Appl. No.: 16/958,746

(22) PCT Filed: Feb. 12, 2020

(86) PCT No.: PCT/CN2020/074865
§ 371 (c)(1),
(2) Date: Oct. 1, 2020

(87) PCT Pub. No.: WO2020/192284
PCT Pub. Date: Oct. 1, 2020

(65) Prior Publication Data
US 2021/0234079 A1    Jul. 29, 2021

(30) Foreign Application Priority Data
Mar. 28, 2019   (CN) .......................... 201910245586.0

(51) Int. Cl.
H01L 33/62    (2010.01)
G09G 3/32    (2016.01)
H01L 27/15    (2006.01)

(52) U.S. Cl.
CPC .............. *H01L 33/62* (2013.01); *G09G 3/32* (2013.01); *H01L 27/156* (2013.01); *G09G 2310/0275* (2013.01)

(58) Field of Classification Search
CPC combination set(s) only.
See application file for complete search history.

(56) References Cited

U.S. PATENT DOCUMENTS

2007/0002243 A1    1/2007  Kim
2008/0048948 A1    2/2008  Koh et al.
(Continued)

FOREIGN PATENT DOCUMENTS

CN        1892322 A       1/2007
CN      101131800 A       2/2008
(Continued)

OTHER PUBLICATIONS

Office Action dated Apr. 28, 2020 for Chinese Patent Application No. 201910245586.0 and English Translation.
(Continued)

*Primary Examiner* — Ratisha Mehta
(74) *Attorney, Agent, or Firm* — Ling Wu; Stephen Yang; Ling and Yang Intellectual Property

(57) ABSTRACT

A display panel and a display apparatus are provided. The display panel includes an active area and a non-active area located at least on one side of the active area, wherein the non-active area includes a first fanout area; a plurality of sub-pixels located in the active area; a plurality of data lines located in the active area and extending from the active area to the first fanout area, the plurality of data lines electrically connected to the plurality of sub-pixels and configured to provide data signals for the plurality of sub-pixels; the first fanout area includes at least two data line fanout sub-areas, and the plurality of data lines are respectively located in the at least two data line fanout sub-areas.

18 Claims, 12 Drawing Sheets

(56) References Cited

U.S. PATENT DOCUMENTS

| | | | | |
|---|---|---|---|---|
| 2016/0063912 A1* | 3/2016 | Zhang | ................... | H01L 27/124 |
| | | | | 345/212 |
| 2017/0358603 A1* | 12/2017 | Choi | .................... | G09G 3/3275 |
| 2017/0371376 A1 | 12/2017 | Chung et al. | | |
| 2018/0033979 A1 | 2/2018 | Jang et al. | | |
| 2018/0337226 A1 | 11/2018 | Liu et al. | | |
| 2019/0281692 A1* | 9/2019 | Jeon | ....................... | H10K 50/86 |
| 2019/0296052 A1 | 9/2019 | Kim et al. | | |
| 2020/0006460 A1* | 1/2020 | Chen | ................. | H10K 59/1315 |
| 2020/0176540 A1* | 6/2020 | Park | .................... | H10K 59/124 |

FOREIGN PATENT DOCUMENTS

| | | | |
|---|---|---|---|
| CN | 107275365 | A | 10/2017 |
| CN | 107544172 | A | 1/2018 |
| CN | 108363254 | A | 8/2018 |
| CN | 108493226 | A | 9/2018 |
| CN | 108598142 | A | 9/2018 |
| CN | 109166515 | A | 1/2019 |
| CN | 109950222 | A | 6/2019 |

OTHER PUBLICATIONS

International Search Report for PCT/CN2020/074865 dated May 9, 2020.

Office Action dated Oct. 29, 2020 for Chinese Patent Application No. 201910245586.0 and English Translation.

* cited by examiner

DISPLAY PANEL AND DISPLAY APPARATUS

CROSS-REFERENCE TO RELATED APPLICATIONS

The present disclosure is a U.S. National Phase Entry of International PCT Application No. PCT/CN2020/074865, having an international filing date of Feb. 12, 2020, which claims the priority of the Chinese patent application No. 201910245586.0 entitled "Flexible Display Panel and Display Apparatus", filed to the CNIPA on Mar. 28, 2019. The above-identified applications are hereby incorporated by reference in their entirety.

TECHNICAL FIELD

Embodiments of the present disclosure relate to, but are not limited to, a display panel and a display device.

BACKGROUND

With the development of display technology, flexible display panels have been widely used in a variety of display technology fields, and the full screen has gradually become the mainstream of display device.

The design of a full screen is to adopt a borderless design at each border position and to pursue a screen-to-body ratio close to 100%. However, due to the limitation of current technology, the full screen claimed in the industry merely refers to a screen with an increased screen-to-body ratio, and it cannot really achieve 100% of screen-to-body ratio. Therefore, reducing the border size of the display panel is still an important means to increase the screen-to-body ratio.

SUMMARY

The following is a summary of subject matter described in detail herein. This summary is not intended to limit the scope of protection of the claims.

In one aspect, an embodiment of the present disclosure provides a display panel, including:

an active area and a non-active area located at least on one side of the active area, wherein the non-active area includes a first fanout area;

a plurality of sub-pixels located in the active area;

a plurality of data lines located in the active area and extending from the active area to the first fanout area, wherein the plurality of data lines are electrically connected to the plurality of sub-pixels and configured to provide data signals for the plurality of sub-pixels;

the first fanout area includes at least two data line fanout sub-areas, and the plurality of data lines extend into the at least two data line fanout sub-areas, respectively.

In an exemplary embodiment, the display panel further includes a high voltage power line and a low voltage power line;

the high voltage power line is located in the non-active area and at least a portion of the high voltage power line is located in the first fanout area; the high voltage power line is configured to transmit high voltage signals to the plurality of sub-pixels, and the high voltage power line includes at least two high voltage power line pins;

the low voltage power line is located in the non-active area, surrounds the active area and is configured to transmit low voltage signals to the plurality of sub-pixels, and the low voltage power line includes at least two low voltage power line pins;

at least one of the at least two high voltage power line pins and the at least two low voltage power line pins is located between the at least two data line fanout sub-areas.

In an exemplary embodiment, the quantity of the at least two data line fanout sub-areas is two, the quantity of the at least two high voltage power line pins is two, the quantity of the at least two low voltage power line pins is two, and the two high voltage power line pins and the two low voltage power line pins are all located between the two data line fanout sub-areas.

In an exemplary embodiment, the quantity of the at least two data line fanout sub-areas is three, and at least one of the at least two high voltage power line pins and the at least two low voltage power line pins is provided between every two data line fanout sub-areas.

In an exemplary embodiment, the quantity of the at least two high voltage power line pins is two, the quantity of the at least two low voltage power line pins is two, the quantity of the at least two data line fanout sub-areas is three, the two high voltage power line pins are respectively located between the three data line fanout sub-areas, and the two low voltage power line pins are respectively located between the three data line fanout sub-areas.

In an exemplary embodiment, the quantity of the at least two high voltage power line pins is two, the quantity of the at least two low voltage power line pins is two, the quantity of the at least two data line fanout sub-areas is five, and the two high voltage power line pins and the two low voltage power line pins are respectively located between the five data line fanout sub-areas.

In an exemplary embodiment, one of the two high voltage power line pins and the two low voltage power line pins is provided between every two of the five data line fanout sub-areas.

In an exemplary embodiment, the two high voltage power line pins are symmetrically provided with respect to a centerline of the display panel, and the two low voltage power line pins are symmetrically provided with respect to the centerline of the display panel.

In an exemplary embodiment, the outermost two data line fanout sub-areas of the at least two data line fanout sub-areas have the same quantity of the data lines.

In an exemplary embodiment, the display panel further includes a bending area located at a side, away from the active area, of the first fanout area, the plurality of data lines extend to the bending area, and the bending area is configured to bend to a back side of the display panel.

An exemplary embodiment further includes a second fanout area located at a side, away from the active area, of the bending area, and the plurality of data lines extend to the second fanout area;

the second fanout area includes a resistance compensation module configured to perform resistance compensation for the plurality of data lines, so that the impedance of the data lines changes gradually.

In another aspect, an embodiment of the present disclosure also provides a display apparatus, including the display panel according to any one of the above.

BRIEF DESCRIPTION OF DRAWINGS

Accompanying drawings are used to provide a further understanding of technical solutions of the embodiments of the present disclosure and form a part of the specification. Together with embodiments of the present disclosure, they are used to explain the technical solutions and do not constitute a limitation on the technical solutions.

DETAILED DESCRIPTION

Hereinafter, embodiments of the present disclosure will be described in detail with reference to the accompanying drawings. Without conflict, embodiments in the present disclosure and features in the embodiments may be combined with each other arbitrarily.

Figure 1:
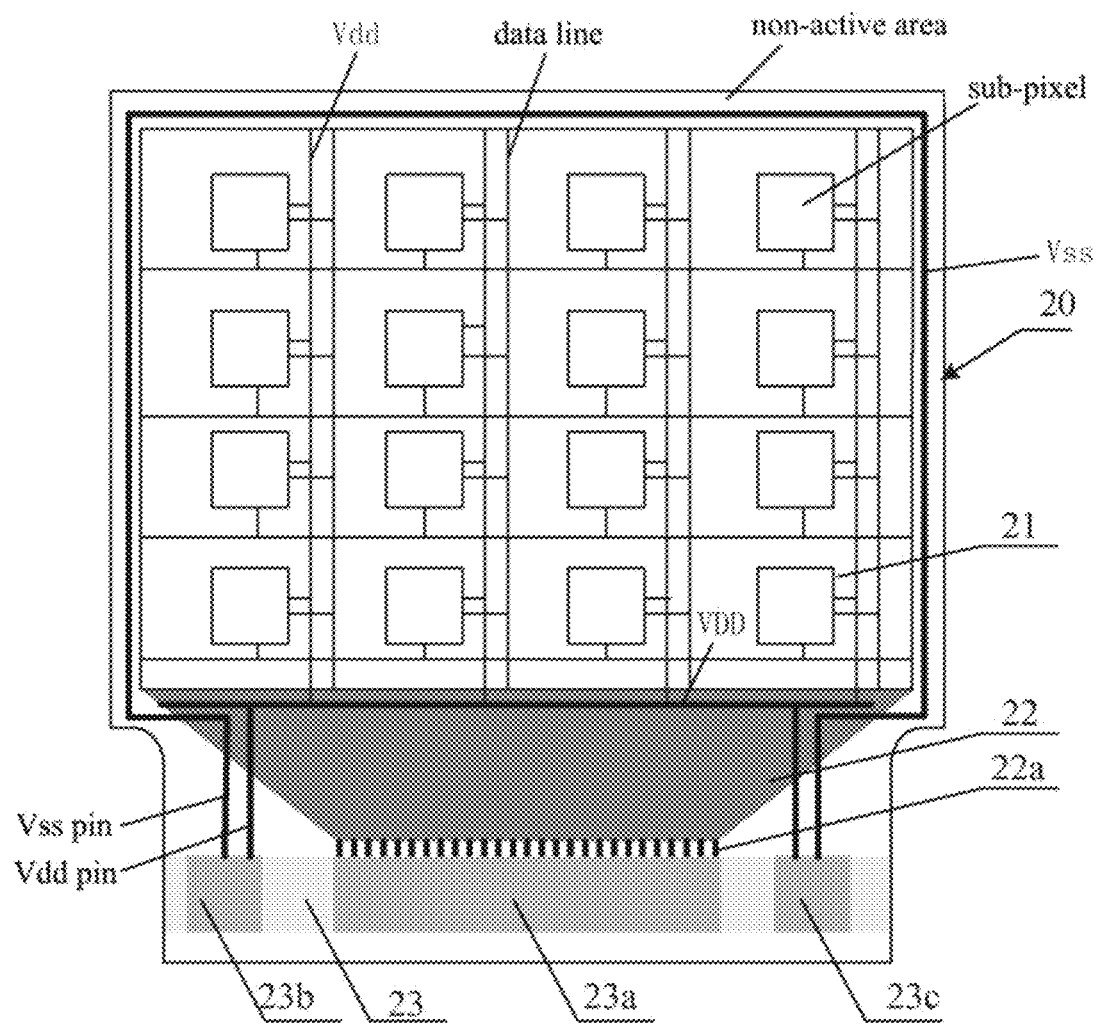
FIG. 1 is a schematic structural diagram of a display panel.

At present, the design of full screen display devices (such as mobile phones) pursues nearly 100% of the screen-to-body ratio, and the adopted main method is to reduce the size of the borders. Compared with the left and right borders, the size of the lower border of the display panel is usually larger. Currently, there are mature reduction schemes for the left and right borders. Since the size of the lower border is limited by many factors, it is more difficult to narrow the lower border. As shown in FIG. 1, it is a schematic structural diagram of a display panel. The display panel 20 includes an active area 21, a non-active area, a plurality of sub-pixels, a plurality of data lines, a high voltage power line Vdd and a low voltage power line Vss, wherein the high voltage power line Vdd includes Vdd pins and the low voltage power line Vss includes two Vss pins. The data lines provide data signals for the plurality of sub-pixels, the high voltage power line transmits high voltage signals to the plurality of sub-pixels, and the low voltage power line transmits low voltage signals to the plurality of sub-pixels. In the structure of the display panel 20, the data lines 22a are usually led out from below the active area 21, i.e., the Data Line Fanout area 22 is located below the active area 21, i.e., the position of the lower border of the display panel 20. In FIG. 1, the data line fanout area 22 is indicated by a dark gray filled area, and the interior of the data line fanout area 22 includes all data lines led out below the display panel 20. Since there are thousands of data lines, not all of the data lines 22a are shown in the data line fanout area 22, data lines 22a are shown only in the positions where the data lines in the data line fanout area 22 are connected to the bending area 23, and the quantity of the data lines 22a shown does not represent the actual quantity of the data lines. Therefore, the size and resolution of the display panel itself and the specifications of the driver Integrated Circuit (IC) affect the overall width of the wiring in the data line fanout area 22, namely, affect the size of the lower border of the display panel. In the above display panel, the size of the lower border cannot be further reduced to increase the screen-to-body ratio.

The following several embodiments can be combined with each other, and the same or similar concepts or processes may not be repeated in some embodiments.

Figure 2:
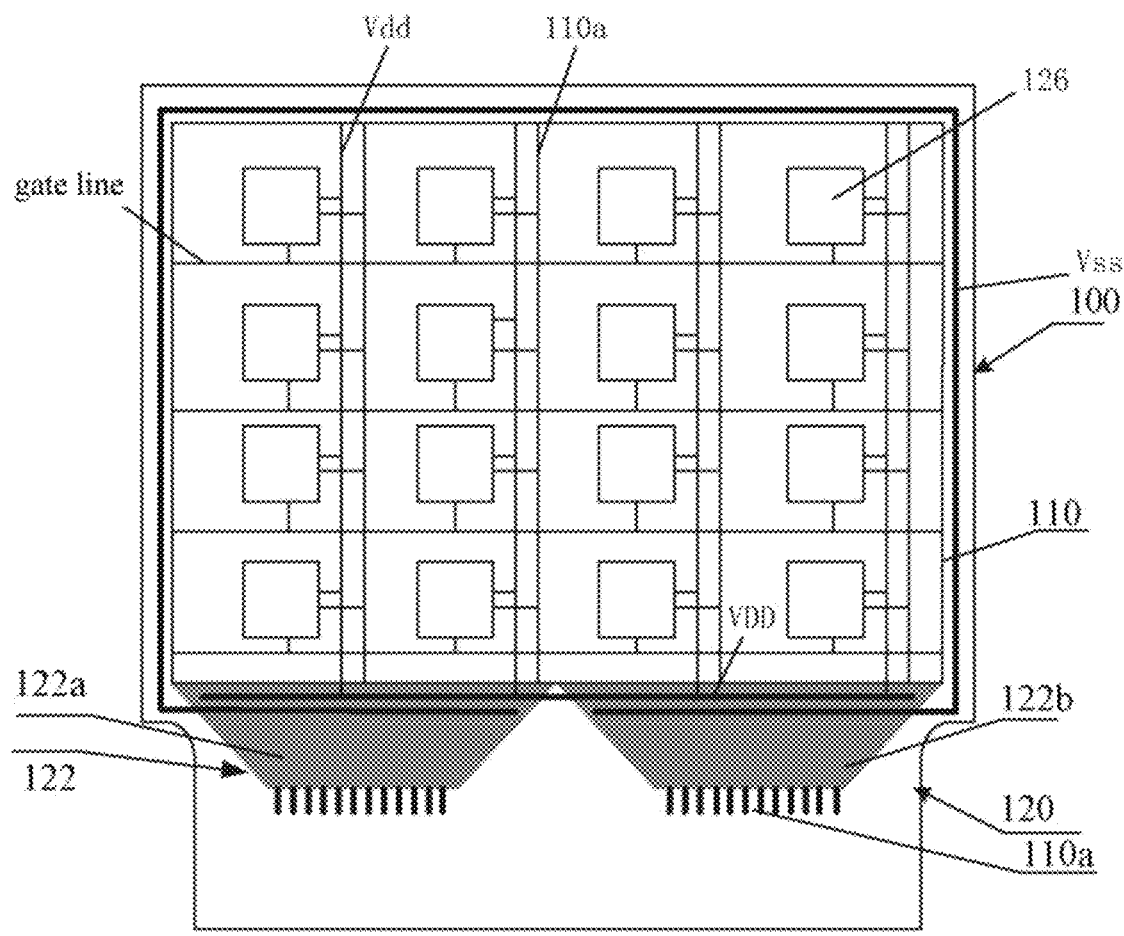
FIG. 2 is a schematic structural diagram of a display panel provided by an embodiment of the present disclosure.

As shown in FIG. 2, an embodiment of the present disclosure provides a display panel 100, which includes an active area 110 and a non-active area 120 located at least on one side of the active area, wherein the non-active area 120 includes a first fanout area 122; a plurality of sub-pixels 126 located in the active area 110; a plurality of data lines 110a located in the active area 110 and extending from the active area 110 to the first fanout area 122, the plurality of data lines electrically connected to the plurality of sub-pixels 126 and configured to provide data signals for the plurality of sub-pixels 126; the first fanout area 122 includes at least two data line fanout sub-areas, and the plurality of data lines are respectively located in the at least two data line fanout sub-areas (such as data line fanout sub-areas 122a and 122b in FIG. 2).

In the drawings of this embodiment and the following embodiments, the data line fanout sub-areas (such as 122a and 122b in FIG. 2) are indicated with dark gray filled areas. The interior of the data line fanout sub-areas include all data lines led out below the active area 110. Since there are thousands of data lines, not all of the data lines 110a are shown in the data line fanout sub-area.

In practical application, the minimum line width and minimum spacing of data lines are related to the process level and design rules. The quantity of data lines in the display panel 100 is related to the resolution, and the size of the active area 110 is determined by the design specifications of the product. A fixed quantity of data lines are connected to the first fanout area 122. With the segmented fanout mode provided by the embodiment of the present disclosure, the data lines in each of the data line fanout sub-areas can be reduced by at least half, or even more, for example, to ⅓, ¼, ⅕ or ⅐, etc. Under the condition that the design specifications of the data lines, the resolution and the size of the display panel are the same, in the display panel 100 of the embodiment of the present disclosure, the space occupied by the wiring is reduced by segmented fanout mode of the data lines in the lower border, so that the width of the first fanout area 122 can be effectively reduced, that is, the size of the lower border in the display panel 100 is reduced.

In an exemplary embodiment, there are at least signal lines other than the data lines between two data line fanout sub-areas, and the signal lines include at least one of: a high voltage power line Vdd (configured to transmit high voltage signals to the plurality of sub-pixels) and a low voltage power line Vss (configured to transmit low voltage signals to the plurality of sub-pixels), a clock signal line (configured to transmit clock signals to the plurality of sub-pixels), and a touch signal line (configured to transmit touch signals to the plurality of sub-pixels). In this embodiment, the data lines are distributed, which can reduce the space occupied by the wiring and reduce the width of the first fanout area 122.

Figure 3:
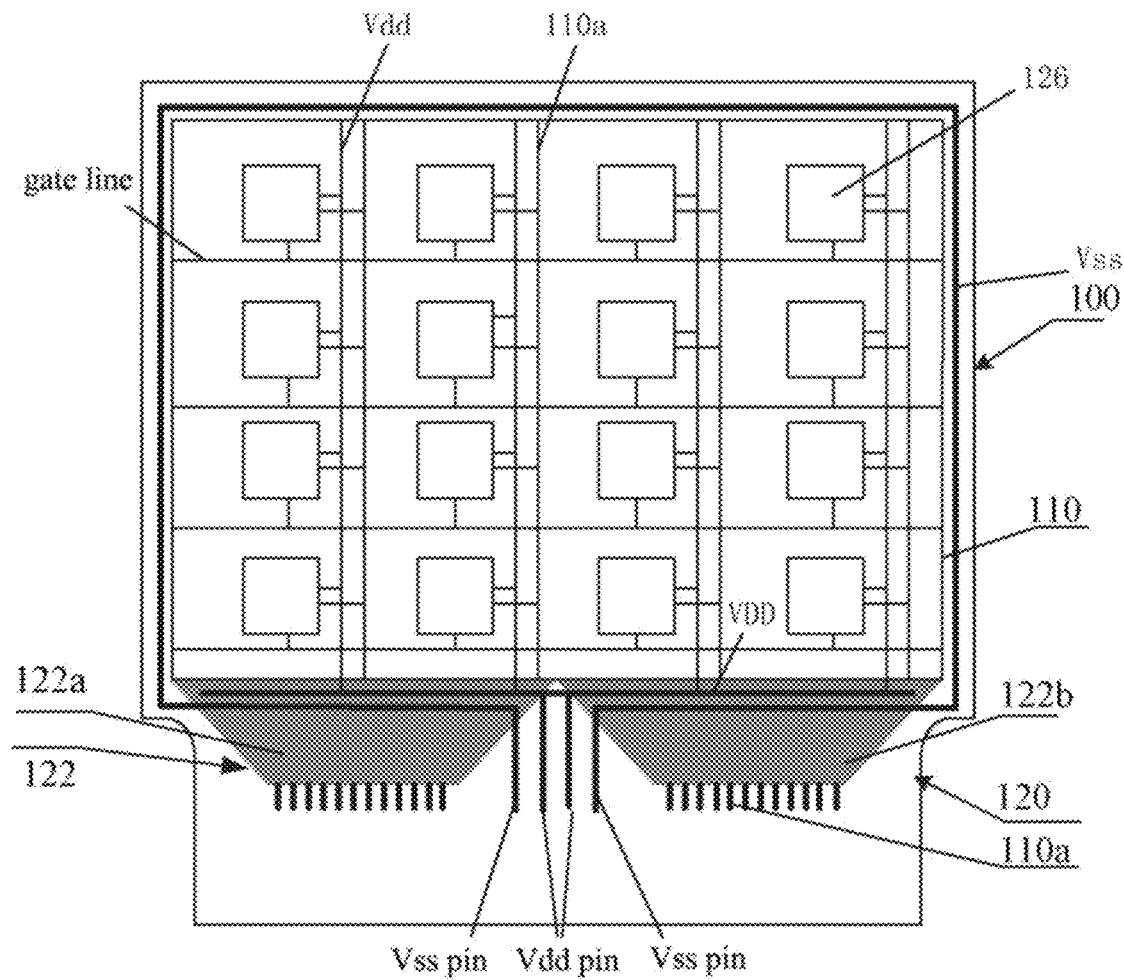
FIG. 3 is a schematic structural diagram of another display panel provided by an embodiment of the present disclosure.

In an exemplary embodiment, as shown in FIG. 3, the display panel 100 further includes a high voltage power line Vdd and a low voltage power line Vss.

The high voltage power line is located in the non-active area 120 and configured to transmit high voltage signals to the plurality of sub-pixels; the high voltage power line includes two high voltage power line pins.

The low voltage power line is located in the non-active area 120 and configured to transmit voltage signals for the plurality of sub-pixels; the low voltage power line includes two low voltage power line pins.

The two high voltage power line pins and the two low voltage power line pins are all located between the two data line fanout sub-areas.

According to the display panel 100 provided by the embodiment of the application, by reasonably designing the data line fanout structure, i.e., segmented fanout of data lines, and using one or more of the high voltage power lines and the low voltage power lines as interval(s) between at least two data line fanout sub-areas, the overall width of wiring of the data line fanout area (i.e., the first fanout area 122) is effectively reduced, i.e., the size of the lower border in the display panel 100 is reduced, thereby increasing the screen-to-body ratio of the display panel 100.

In another exemplary embodiment, the two high voltage power line pins and the two low voltage power line pins may be partially located between the two data line fanout sub-areas and partially located outside the two data line fanout sub-areas.

Figure 4:
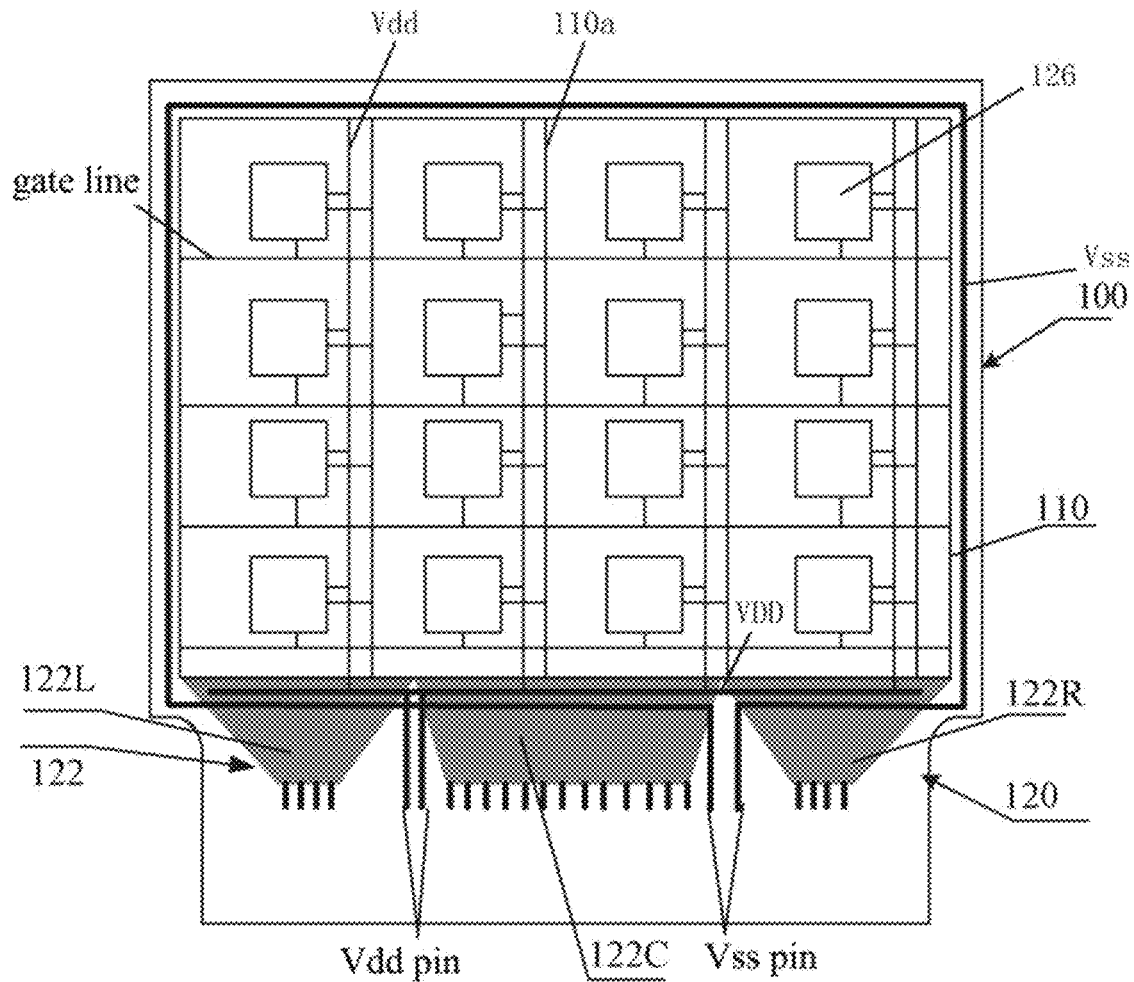
FIG. 4 is a schematic structural diagram of further another display panel provided by an embodiment of the present disclosure.

FIG. 4 is a schematic structural diagram of another display panel provided by an embodiment of the present disclosure. Based on the structure of the display panel 100 shown in FIG. 2, in the display panel 100 provided by the embodiment of the present disclosure, the data line fanout sub-area may include a left data line fanout sub-area 122L, a central data line fanout sub-area 122C, and a right data line fanout sub-area 122R which are sequentially arranged.

In the embodiment of the present disclosure, the high voltage power line pins may be located between the left data line fanout sub-area 122L and the central data line fanout sub-area 122C, and the low voltage power line pins may be located between the right data line fanout sub-area 122R and the central data line fanout sub-area 122C. That is, high voltage power line pins and low voltage power line pins are used as the intervals for segment fanout of the data lines.

Assuming that the total quantity of data lines in the active area 110 is a, the quantity of data lines in the left data line fanout sub-area 122L is r, the quantity of data lines in the right data line fanout sub-area 122R is r, that is, the quantity of data lines in the left data line fanout sub-area 122L and the quantity of data lines in the right data line fanout sub-area 122R are the same, and the quantity of data lines in the central data line fanout sub-area 122C is a−2r. In the embodiment of the present disclosure, the ratio of the quantity of data lines in central area, a−2r, to the total quantity of data lines, a, can be reasonably configured by a designer according to the size and shape of the active area 110 and the design specifications of the display panel 100.

Figure 5:
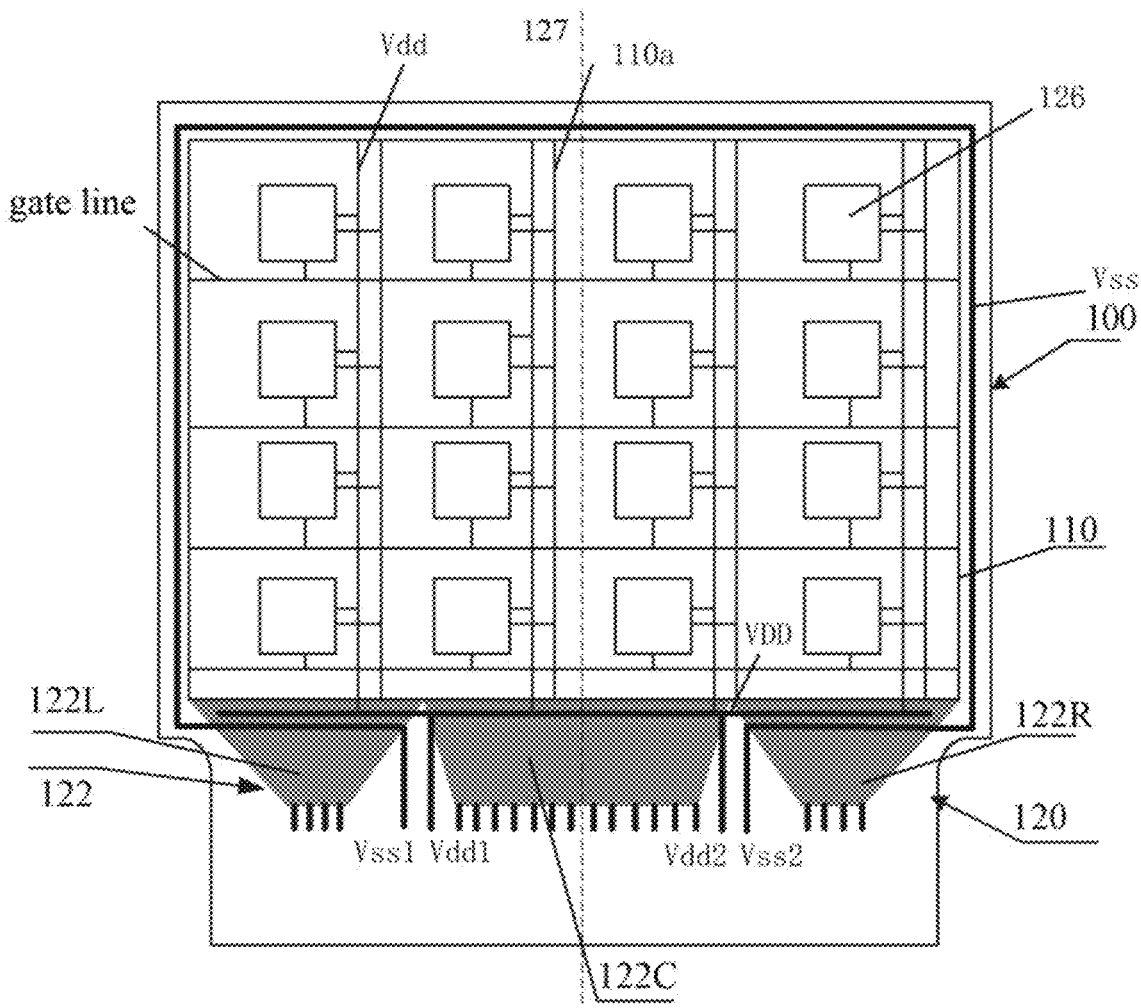
FIG. 5 is a schematic structural diagram of another display panel provided by an embodiment of the present disclosure.

In order to realize uniform light emission of the active area 110, the display panel 100 generally adopts a double-sided drive mode, i.e., both the left and right sides of the active area 110 can be provided with a high voltage power line Vdd and a low voltage power line Vss. In one possible implementation of the embodiment of the present disclosure, as shown in FIG. 5, a schematic structural diagram of another display panel provided by the embodiment of the present disclosure is shown. FIG. 5 shows an example based on the structure shown in FIG. 4. The high voltage power line includes two high voltage power line pins Vdd1 and Vdd2, and the low voltage power line includes two low voltage power line pins Vss1 and Vss2, wherein the high voltage power line pin Vdd1 and the low voltage power line pin Vss1 are located between the left data line fanout sub-area 122L and the central data line fanout sub-area 122C, and the high voltage power line pin Vdd2 and the low voltage power line pin Vss2 are located between the right data line fanout sub-area 122R and the central data line fanout sub-area 122C.

Figure 6:
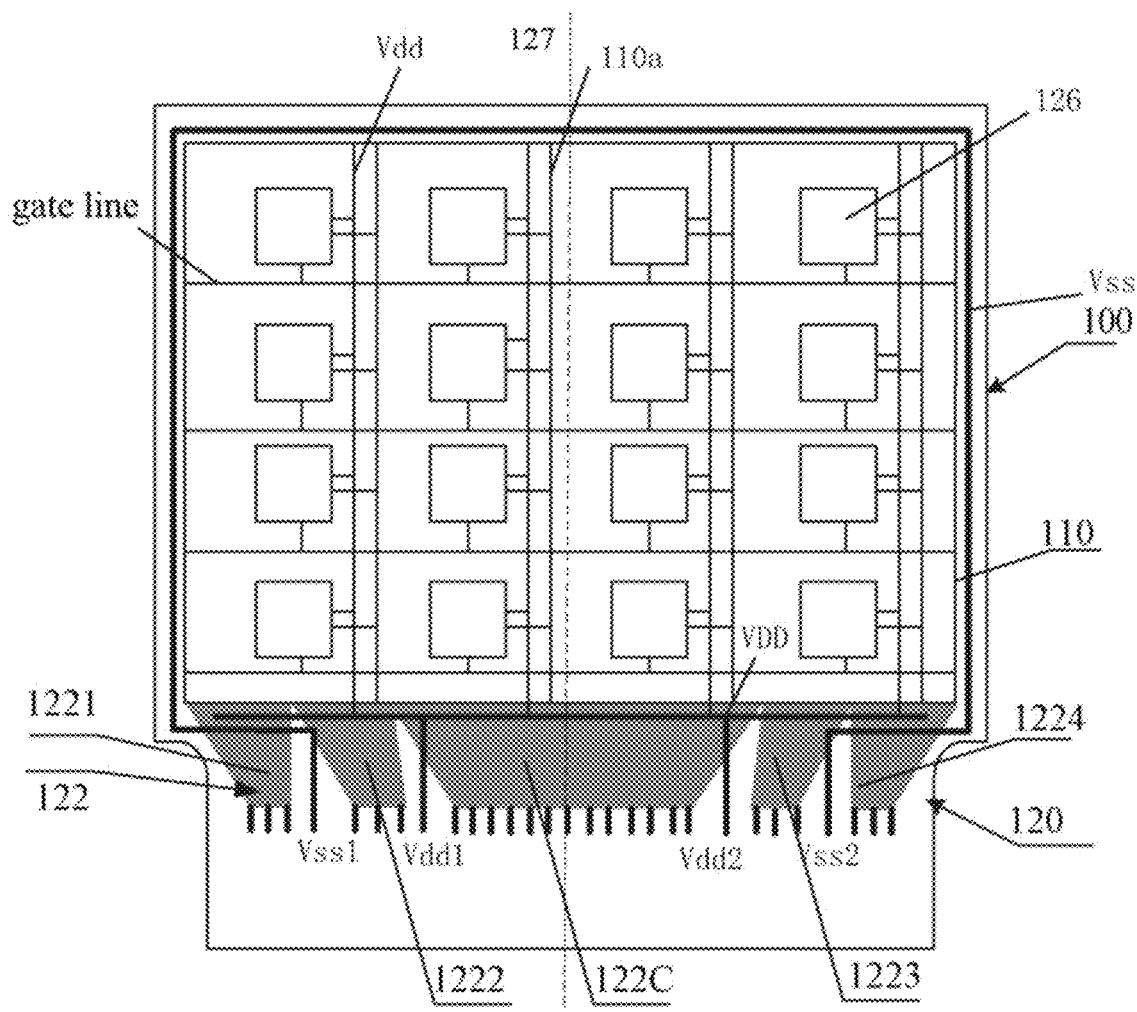
FIG. 6 is a schematic structural diagram of another display panel provided by an embodiment of the present disclosure.

In an exemplary embodiment, the two high voltage power line pins Vdd1 and Vdd2 are symmetrically arranged with respect to the centerline of the display panel 100, and the two low voltage power line pins Vss1 and Vss2 are symmetrically arranged with respect to the centerline of the display panel 100. The centerline of the display panel 100 is a centerline from the first side to the second side of the display panel 100 on the plane where the display panel is located, and the first side and the second side are not the sides where the first fanout area 122 is located. As shown in FIGS. 5 and 6, the dashed line 127 is the centerline of the display panel 100.

As shown in FIG. 6, a schematic structural diagram of another display panel provided in an embodiment of the present disclosure is shown. FIG. 6 shows an example based on the structure shown in FIG. 5. The first fanout area 122 includes five data line fanout sub-areas, which are sequentially: a first data line fanout sub-area 1221, a second data line fanout sub-area 1222, a data line fanout sub-area 122C, a third data line fanout sub-area 1223, and a fourth data line fanout sub-area 1224. Based on the above structure, high voltage power line pins or low voltage power line pins may be provided between any two adjacent sub-areas of the five data line fanout sub-areas, or only between some of the adjacent sub-areas, that is, the two high voltage power line pins Vdd1 and Vdd2 and the two low voltage power line pins Vss1 and Vss2 may be partially located between the five data line fanout sub-areas and partially located outside the five data line fanout sub-areas.

In an exemplary embodiment, the two high voltage power line pins Vdd1 and Vdd2 and the two low voltage power line pins Vss1 and Vss2 are respectively located between the five data line fanout sub-areas.

In an exemplary embodiment, one of the two high voltage power line pins and the two low voltage power line pins is provided between every two of the five data line fanout sub-areas. As shown in FIG. 6, the low voltage power line pin Vss1 is located between the data line fanout sub-area 1221 and the data line fanout sub-area 1222, the high voltage power line pin Vdd1 is located between the data line fanout sub-area 1222 and the data line fanout sub-area 122C, the high voltage power line pin Vdd2 is located between the data line fanout sub-area 1223 and the data line fanout sub-area 122C, and the low voltage power line pin Vss1 is located between the data line fanout sub-area 1223 and the data line fanout sub-area 1224.

In an exemplary embodiment, the data line fanout sub-area 1221, the data line fanout sub-area 1222, the data line fanout sub-area 1223, and the data line fanout sub-area 1224 each have r/2 data lines, that is, the outermost data line fanout sub-areas have the same quantity of data lines, and the secondary outer data line fanout sub-areas have the same quantity of data lines. This scheme can improve the uniformity of display brightness.

Figure 7:
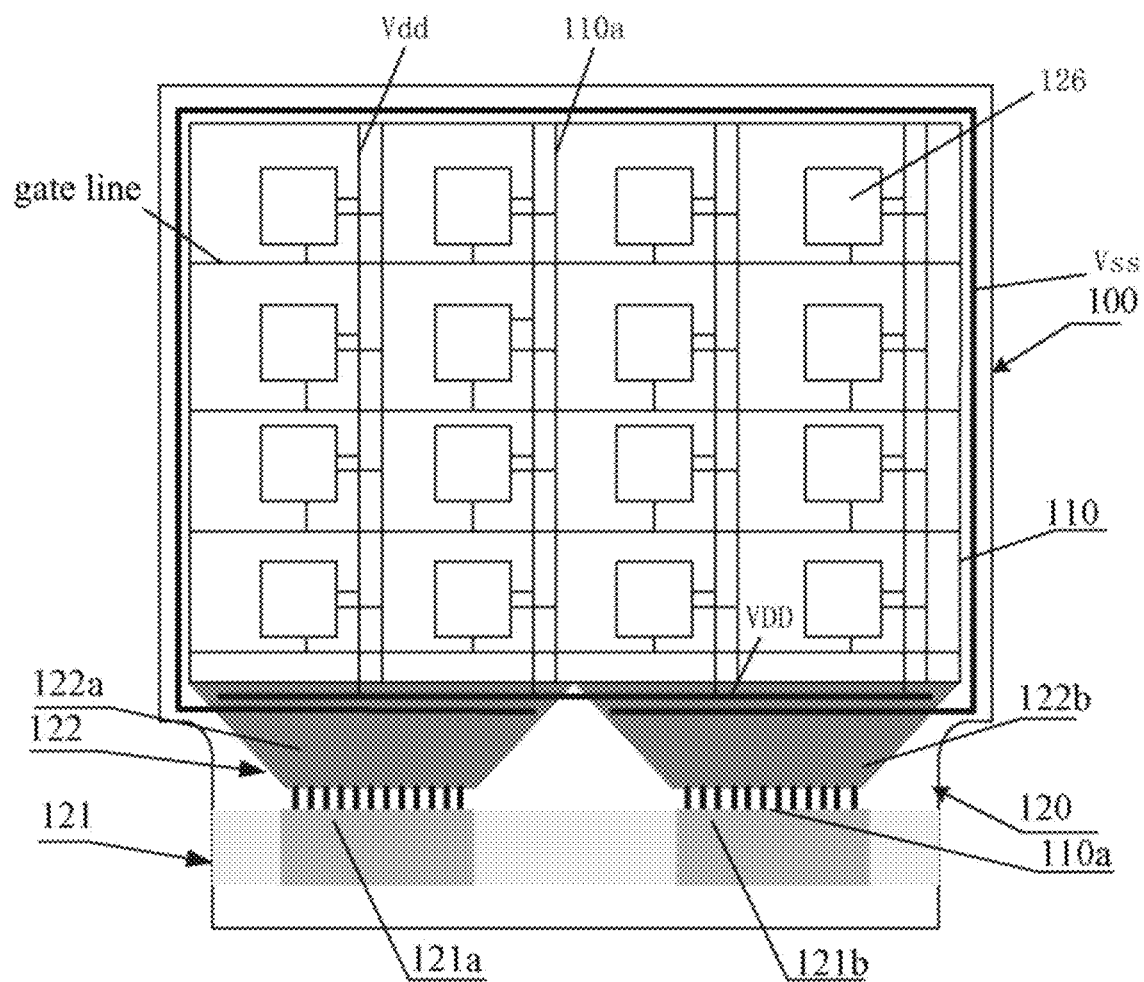
FIG. 7 is a schematic structural diagram of another display panel provided by an embodiment of the present disclosure.

FIG. 7 is a schematic structural diagram of a display panel provided by an embodiment of the present disclosure. The display panel 100 provided in this embodiment may include an active area 110 and a non-active area 120 located at a periphery of the active area 110, the non-active area 120 including a bending area 121 and a first fanout area 122 configured to connect data lines 110a in the active area 110 to the bending area 121, and further include a plurality of sub-pixels 126 located in the active area 110, a plurality of data lines located in the active area 110 and extending from the active area 110 to the first fanout area 122, the plurality of data lines electrically connected to the plurality of sub-pixels 126 and configured to provide data signals for the plurality of sub-pixels, and the bending area 121 configured to bend to a back side of the display panel.

In the above structure of the embodiment of the present disclosure, the first fanout area 122 includes at least two data line fanout sub-areas (such as the data line fanout sub-areas 122a and 122b in FIG. 7), and the data lines 110a in the data line fanout sub-areas are connected to the data line bending areas (such as the data line bending areas 121a and 121b in FIG. 7), corresponding to the data line fanout sub-areas one by one, in the bending area 121. In the drawings of the following embodiments of the present disclosure, the data line fanout sub-areas (such as 122a and 122b in FIG. 7) are shown with dark gray filled areas. The interior of the data line fanout sub-areas include all the data lines led out below the active area 110. Since there are thousands of data lines, no specific data lines 110a are shown in the data line fanout sub-areas, data lines 110a are shown only in the positions where the data lines in the data line fanout sub-areas are connected to the corresponding data line bending area, and the quantity of the data lines 110a shown does not represent the actual quantity of the data lines.

The display panel 100 provided in the embodiment of the present disclosure can further reduce the size of the fanout portion. The structural arrangement of the current display panel is a non-active area and an active area (AA) from outside to inside. The active area is an area for effective display in the panel, i.e. an area in the entire panel in which light emitting units are arranged. The non-active area is a border around the active area, in which a drive circuit can be arranged. Generally, the lower border of the display panel is provided with fanout areas, bending areas, drive IC and the like of data lines, as shown in FIGS. 1 and 7, in which the positional relationship between the active area and the non-active area is schematically shown. The left and right borders of the display panel can be reduced by using known technical means. The embodiment of the application can reduce the size of the lower border with data line fanout areas to achieve the purpose of increasing the screen-to-body ratio.

The structure of the display panel 100 provided by an embodiment of the present disclosure is as shown in FIG. 7, which includes a non-active area 120 except for an active area 110 capable of performing effective display. In the manner in which the display panel 100 in the embodiment of the present disclosure realizes a full screen (i.e., increasing screen-to-body ratio) based on the bendable structure of the bending area in the flexible display technology, the size between the bending area 121 in the non-active area 120 and the active area 110 is reduced, i.e., the size of the data line fanout portion (i.e., the first fanout area 122) is reduced. The data lines in the active area 110 are generally vertically arranged, and each data line is independently connected with the drive IC, that is, all data lines are connected to the drive IC in parallel, and the drive IC controls these data lines to provide data information for display for light-emitting pixels in the active area 110. The higher the resolution of the display panel is, the larger the quantity of data lines is.

For example, if the resolution of the display panel is 1080*1920, the quantity of data lines is 1080, that is, 1080 data lines are connected in parallel from the first fanout area 122 to the bending area 121. Referring to the display panel 20 shown in FIG. 1, generally, all data lines 22a are connected to the middle area of the bending area 23 (i.e., data line bending area 23a). Due to the user's demand for high resolution of the display panel 20, there are thousands of data lines 22a in the display panel 20, and a large quantity of data lines 22a in the diverging area are connected to the concentrated area (i.e., data line bending area 23a) in the bending area 23. In this structure, it is difficult to further reduce the width of the data line fanout area 22.

Since the quantity of data lines in the active area 110 is usually very large, in the data line fanout area 22 of FIG. 1 and the first fanout area 122 of FIG. 7, the data lines are schematically shown only at the positions where the fanout area is connected to the data line bending area, which do not represent the quantity of data lines in the display panel, and are only used to schematically show the implementation of connecting the data lines of the active area to the bending area.

In the embodiment of the present disclosure, the first fanout area 122 is divided into at least two data line fanout sub-areas (such as 122a and 122b in FIG. 7), and the areas for connecting data lines in the bending area 121 (such as data line bending areas 121a and 121b in FIG. 7) correspond to the data line fanout sub-areas (122a and 122b) one by one, as shown in FIG. 7. The data line bending area 121a corresponds to the data line fanout sub-area 122a (i.e., the data lines in the data line fanout sub-area 122a are connected into the data line bending area 121a), and the data line bending area 121b corresponds to the data line fanout sub-area 122b (i.e., the data lines in the data line fanout sub-area 122b are connected into the data line bending area 121b). In addition, the quantity of data lines in corresponding data line fanout sub-area and the quantity of data lines in data line bending area in the embodiment of the present disclosure are the same. Based on the structure of the bending area 121 provided by the embodiment of the present disclosure, not all of a large quantity of data lines in the diverging area are connected to one concentrated area, but the data lines in the diverging area are connected to different areas of the bending area 121 in segments.

In one implementation of the embodiment of the present disclosure, in addition to the data lines 110a, the lines that are led out below the active area 110 and connected to the bending area 121 also comprise the lines such as a high voltage power line Vdd (configured to provide high voltage signals for the plurality of sub-pixels) and a low voltage power line Vss (configured to provide low voltage signals for the plurality of sub-pixels). During normal display of the display panel, power can be continuously supplied to the light emitting unit through the high voltage power line Vdd and the low voltage power line Vss to enable the light emitting unit to be in a lighting state. In this way, scanning can be performed through TFT in a thin film transistor (TFT) array layer to turn on the TFT at a certain timing, thereby lighting the corresponding light emitting unit. Therefore, clock signal lines can also be included. Since the data lines 22a of the display panel 20 are collectively connected to the middle area of the bending area 23 (i.e., data line bending area 23a), the high voltage power line Vdd and the low voltage power line Vss are respectively connected to two side areas of the bending area 23, such as the power line bending areas 23b and 23c in FIG. 1.

Figure 8:
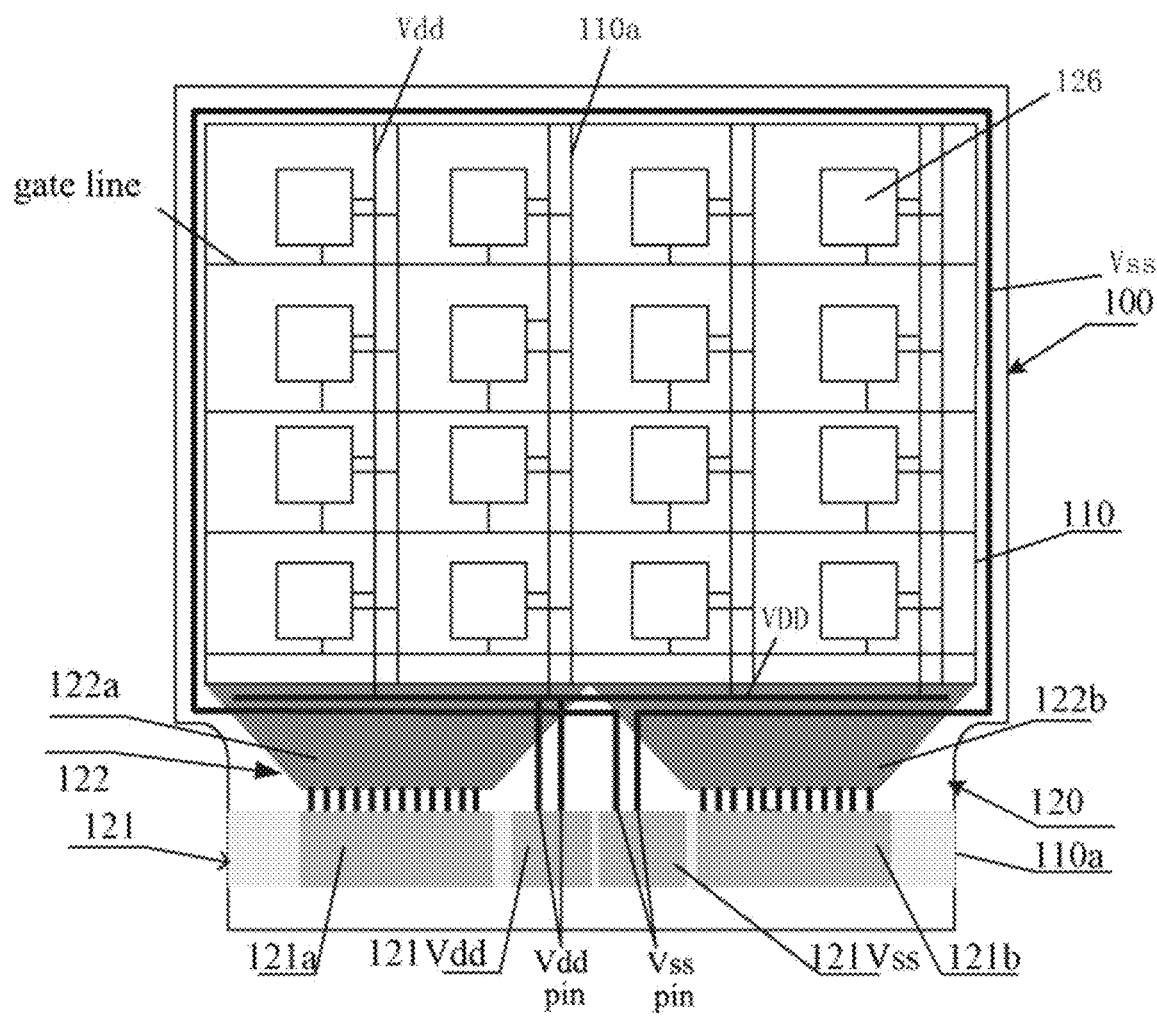
FIG. 8 is a schematic structural diagram of another display panel provided by an embodiment of the present disclosure.

Based on the mode of fanning out data lines in the first fanout area 122 in segments in the embodiment of the present disclosure, there is a certain spacing between at least two data line bending areas in the bending area 121, and one or more of the following bending areas may be provided between the at least two data line bending areas: a high voltage power line bending area 121 Vdd and a low voltage power line bending area 121 Vss. As shown in FIG. 8, a schematic structural diagram of another display panel provided in an embodiment of the present disclosure is shown, in which the high voltage power line bending area 121 Vdd is configured to connect a high voltage power line Vdd of the light emitting unit in the active area 110, and the low voltage power line bending area 121 Vss is configured to connect a low voltage power line Vss of the light emitting unit in the active area 110. FIG. 8 shows an example in which the high voltage power line bending area 121 Vdd and the low voltage power line bending area 121 Vss are provided between two adjacent data line bending areas 121a and 121b. According to the function or design specifications of the display panel 100, the bending area 121 may further include a Clock signal (Clk) bending area (not shown in FIG. 8), a touch signal bending area (not shown in FIG. 8), and the like.

In one implementation of the embodiment of the present disclosure, a non-data line bending area is provided between at least two data line bending areas in the bending area, and the non-data line bending area is provided to connect signal lines other than data lines in the active area. The non-data line bending area includes one or more of the following bending areas: a high voltage power line bending area, a low voltage power line bending area, a clock signal bending area and a touch signal bending area.

In practical application, the minimum line width and minimum spacing of data lines are related to the process level and design rules, the quantity of data lines in the display panel 100 is related to the resolution, and the size of the active area 110 is determined by the design specifications of the product. A fixed quantity of data lines are connected to the first fanout area 122. With the segmented fanout mode provided by the embodiment of the present disclosure, the data lines connected into each data line bending area and the data lines in the corresponding data line fanout sub-area can be reduced by at least half or even more, for example, to ⅓, ¼, ⅕ or ⅐, etc. Under the condition that the design specifications of the data lines, the resolution and the size of the display panel are the same, in the display panel 100 of the embodiment of the present disclosure, the width of the first fanout area 122 can be effectively reduced, that is, the size of the lower border in the display panel 100 is reduced, by reducing the space occupied by the wiring by the mode of fanning out the data lines in the lower border in segments. In addition, the size of the first fanout area 122 configured to connect the data lines to the bending area 121 is not only related to the above parameters, but also the size of the active area 110 and the specification of the drive IC can be considered.

The display panel 100 provided by the embodiment of the application includes an active area and a non-active area 120 located at the periphery of the active area 110, wherein the non-active area 120 includes a bending area 121 and a first fanout area 122 configured to connect the data lines in the active area 110 to the bending area 121, and the first fanout area 122 includes at least two data line fanout sub-areas. The data lines in the data line fanout sub-area are connected to the data line bending areas, corresponding to the data line fanout sub-areas one by one, in the bending area 121, and one or more of the following bending areas can be provided between at least two data line bending areas in the bending area 121: a high voltage power line bending area 121 Vdd and a low voltage power line bending area 121 Vss. According to the display panel 100 provided by the embodiment of the application, by reasonably designing the fanout structure of the data lines, i.e., fanning out the data lines in segments, and using one or more of a high voltage power line bending area and a low voltage power line bending area as interval(s) between at least two data line bending areas, the wiring mode of the lines in the bending area is reasonably designed, and on the basis of the bending structure of the lower border in the flexible display technology, the overall width of wiring in the data line fanout area (i.e., the first fanout area 122) is effectively reduced, i.e., the size of the lower border in the display panel 100 is reduced, thereby increasing the screen-to-body ratio of the display panel 100.

The embodiments of the present disclosure do not limit the data line bending areas to only two shown in FIGS. 7 and 8 (i.e., 121a and 121b), nor do they limit the data line fanout sub-areas to two shown in FIGS. 7 and 8 (i.e., 122a and 122b), which may be 2 to 7, or may be other quantities. In an exemplary embodiment, the quantity of the data line fanout sub-areas is an odd number.

In addition, the embodiments of the present disclosure do not limit that each of the data line fanout sub-areas (or each of the data line bending areas) has an equal quantity of data lines. FIGS. 7 and 8 show that the data lines in both data line bending areas are half of the total quantity, and can be reasonably configured according to the shape of the active area 110 and actual use requirements in actual application. The mode of partitioning the bending area 121 and the first fanout area 122 will be described in detail below through several embodiments.

In the above-mentioned embodiments, it has been explained that in addition to the data lines 110a, the lines that are led out below the active area 110 and connected to the bending area 121 may also include the lines such as a high voltage power line Vdd and a low voltage power line Vss. Thus, the first fanout area 122 of the embodiment of the present disclosure may further include a high voltage power line fanout sub-area and a low voltage power line fanout sub-area, wherein the high voltage power line fanout sub-area is configured to connect the high voltage power line Vdd to the bending area 121, and the low voltage power line fanout sub-area is configured to connect the low voltage power line Vss to the bending area 121. In addition, in the manufacturing process of the display panel, the high voltage power line Vdd, the low voltage power line Vss and the data lines are usually manufactured in different layers, i.e., fanout sub-areas of different lines are also in different process layers in the first fanout area 122, therefore, projections of at least one of the data line fanout sub-areas and one or more of the high voltage power line fanout sub-areas and the low voltage power line fanout sub-areas on the plane, on which the display panel 100 is located, have an overlapping area. In practical application, with the projection of the fanout sub-area of which lines in a different layer and the projection of a certain data line fanout sub-area has an overlapping area, can be planned by designers according to the fanout mode of the actual data line sub-areas and the fanout mode of other lines.

Although the data line fanout sub-areas and the high voltage power line fanout sub-area 122 Vdd and the low voltage power line fanout sub-area 122 Vss in the first fanout area 122 of the embodiment of the present disclosure are located in different process layers, and their projections may overlap, when the lines in the one or more fanout sub-areas are connected into the bending area 121, they are connected to the same process layer by means of jumper, that is, all the lines connected into the bending area 121 are located in the same layer. Therefore, the embodiment of the present disclosure also adopts, in the bending area 121, the mode of bending data lines by partitioning the bending area, and tries to provide bending areas of other lines in the interval area between at least two data line bending areas, so as to reasonably plan the wiring space in the bending area 121.

Figure 9:
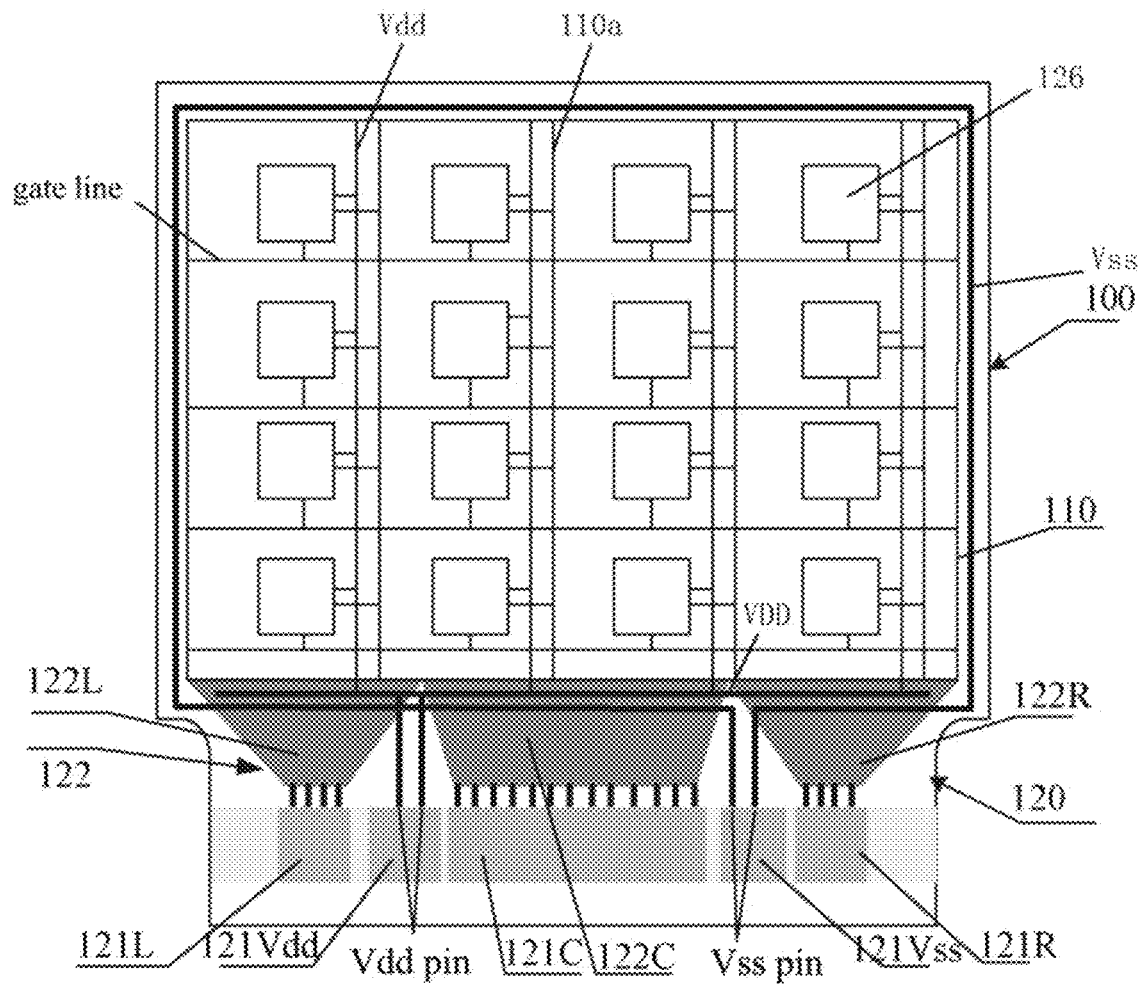
FIG. 9 is a schematic structural diagram of another display panel provided by an embodiment of the present disclosure.

FIG. 9 is a schematic structural diagram of another display panel provided by an embodiment of the present disclosure. Based on the structure of the display panel 100 shown in FIG. 7, in the display panel 100 provided by the embodiment of the present disclosure, the data line bending area of the bending area 121 can be divided into three portions, including, for example, a central data line bending area 121C located directly below the central area of the active area 110, a left data line bending area 121L located directly below the left area of the active area 110, and a right data line bending area 121R located directly below the right area of the active area 110. The left area of the active area 110 is an area of the active area 110 near a first side of the display panel 100 (the left side in FIG. 9), the right area of the active area 110 is an area near a second side of the display panel 100 (the right side in FIG. 9), the central area of the active area 110 is an area between the left area of the active area 110 and the right area of the active area 110, the first side and the second side are opposite sides, and are adjacent to a third side where the data line fanout sub-area is located.

In the embodiment of the present disclosure, the bending area 121 is partitioned into three sections. FIG. 9 shows the three data line bending areas which are non-uniformly arranged as an example. Accordingly, since the data line fanout sub-areas resulted by partitioning the first fanout area 122 correspond to the data line bending areas (121C, 121L and 121R) one by one, the data line fanout sub-areas may include a central data line fanout sub-area 122C configured to connect data lines in the central area of the active area 110 to the central data line bending area 121C, a left data line fanout sub-area 122L configured to connect data lines in the left area of the active area 110 to the left data line bending area 121L, and a right data line fanout sub-area 122R configured to connect data lines in the right area of the active area 110 to the right data line bending area 121R.

In the embodiment of the present disclosure, the partitioning and corresponding mode between the data line fanout sub-areas and the data line bending areas are, for example: assuming that the total quantity of data lines in the active area 110 is a, the quantity of data lines in the left area and the right area is r respectively, and the quantity of data lines in the central area is a−2r, wherein the central area is a data line sub-area with the largest quantity of data lines of the active area 110, and the a−2r data lines in this portion are connected to the central data line bending area 121C through the central data line fanout sub-area 122C connected to the central area of the active area 110. The left and right areas of the active area 110 have the same quantity of data lines and are symmetrically distributed. The r data lines of the left area are connected to the left data line bending area 121L through the left data line fanout sub-area 122L connected to the left area of the active area 110, and the r data lines of the right area are connected to the right data line bending area 121R through the right data line fanout sub-area 122R connected to the right area of the active area 110. The ratio of the quantity of data lines in central area, a−2r, to the total quantity of data lines, a, can be reasonably configured by a designer according to the size and shape of the active area 110 and the design specifications of the display panel 100.

In the embodiment of the present disclosure, the high voltage power line bending area 121 Vdd may be located between the left data line bending area 121L and the central data line bending area 121C, and the low voltage power line bending area 121 Vss may be located between the right data line bending area 121R and the central data line bending area 121C.

In the embodiment of the present disclosure, the first fanout area 122 may further include other wires connecting the signal lines in the active area 110 to the bending area 121, including, for example, a high voltage power line Vdd and a low voltage power line Vss, and a clock signal line Clk, etc. Therefore, the high voltage power line Vdd or the low voltage power line Vss may be provided between adjacent fanout sub-areas of the data line, i.e., the high voltage power line Vdd and the low voltage power line Vss are used as intervals for fanning out data lines in segments. Accordingly, in the bending area 121, the high voltage power line bending area 121 Vdd configured to connect the high voltage power line Vdd and the low voltage power line bending area 121 Vss configured to connect the low voltage power line Vss may be used as intervals between adjacent data line bending areas. In the embodiment of the present disclosure, part of the structure in the display panel 100 is used as the intervals between segmented fanout and data line bending area, so that the structure inside the display panel 100 is reasonably planned and utilized without adding new structures.

In order to realize uniform light emission of the active area 110, the display panel 100 generally adopts a double-sided drive mode, i.e., both the left and right sides of the active area 110 can be provided with symmetrically arranged high voltage power lines Vdd and symmetrically arranged low voltage power lines Vss. Accordingly, the low voltage power line bending area 121 Vss in the bending area 121 may include a first low voltage power line bending area 121 Vss1 and a second low voltage power line bending area 121 Vss2 symmetrically arranged with respect to the centerline of the active area 110, and the high voltage power line bending area 121 Vdd may also include a first high voltage power line bending area 121 Vdd1 and a second high voltage power line bending area 121 Vdd2 symmetrically arranged with respect to the centerline of the active area 110.

FIGS. 7 to 9 do not schematically show the symmetrically arranged Vdd and Vss. In practical application, the high voltage power line bending area 121 Vdd and the low voltage power line bending area 121 Vss in the bending area 121 of FIGS. 7 to 9 can be configured symmetrically, and the segmented fanout mode can be reasonably configured based on the quantity and position of the data line bending areas in the bending area 121 of FIGS. 7 to 9.

In addition, for Vdd and Vss, which are asymmetrically arranged as shown in FIGS. 7 to 9, uniform light emission of the light emitting unit in the active area 110 can be realized by means of resistance compensation.

Figure 10:
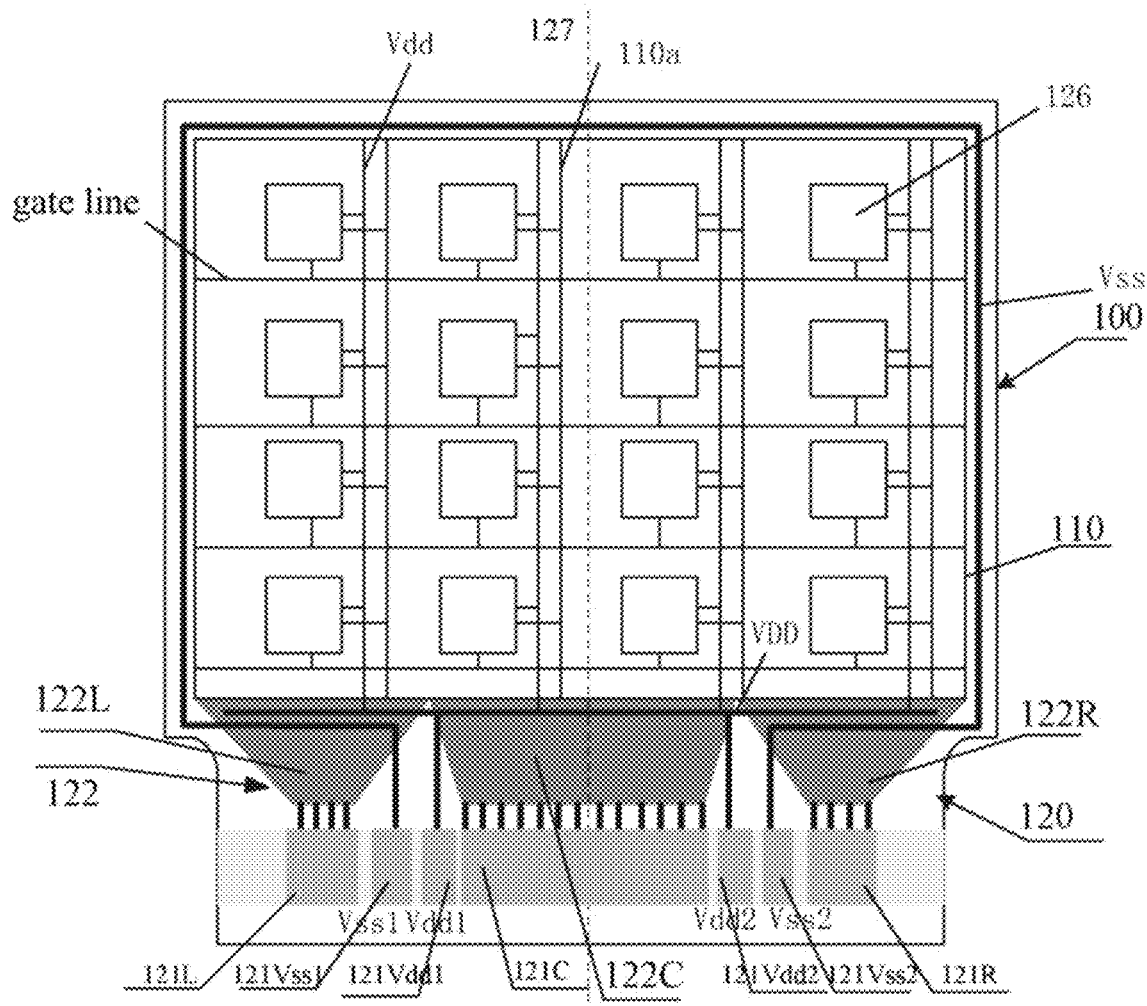
FIG. 10 is a schematic structural diagram of another display panel provided by an embodiment of the present disclosure.

In one possible implementation of the embodiment of the present disclosure, as shown in FIG. 10, a structural diagram of another display panel provided in an embodiment of the present disclosure is shown. FIG. 10 shows an example based on the structure shown in FIG. 9, that is, FIG. 10 also includes three data line bending areas (i.e., 121C, 121L and 121R). In the bending area 121 of the display panel 100 shown in FIG. 10, the first low voltage power line bending area 121 Vss1 and the first high voltage power line bending area 121 Vdd1 are located between the left data line bending area 121L and the central data line bending area 121C. The second low voltage power line bending area 121 Vss2 and the second high voltage power line bending area 121 Vdd2 are located between the right data line bending area 121R and the central data line bending area 121C. The interval of segmented data lines in the bending area 121 is shown in FIG. 10.

Figure 11:
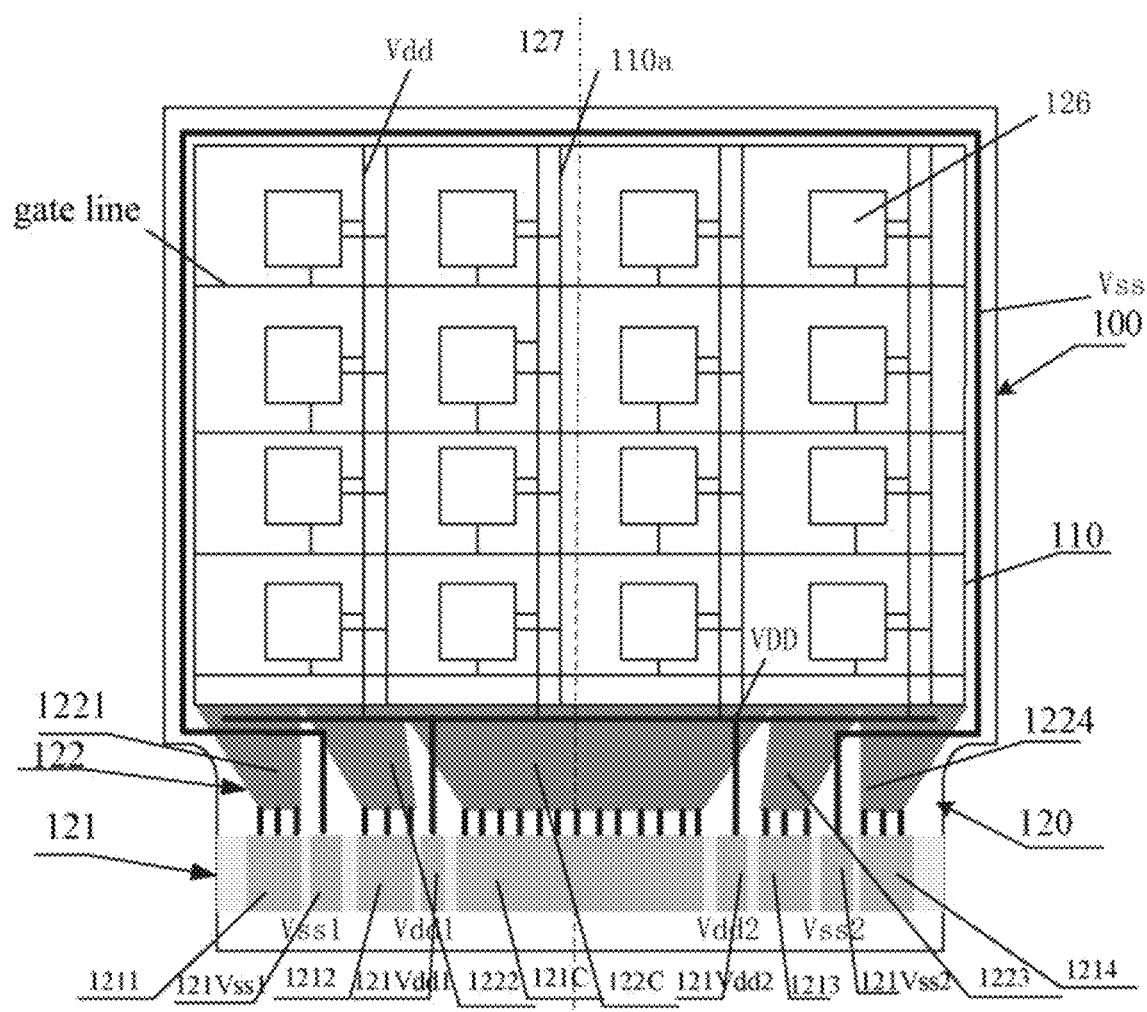
FIG. 11 is a schematic structural diagram of another display panel provided by an embodiment of the present disclosure.

In another possible implementation of the embodiment of the present disclosure, the bending area 121 is divided into five data line bending areas, as shown in FIG. 11, which is a schematic structural diagram of another display panel provided in the embodiment of the present disclosure. FIG. 11 shows an example based on the structure shown in FIG. 10. The central data line bending area 121C is the same as that in FIG. 10. The left data line bending area 121L includes a first data line bending area 1211 and a second data line bending area 1212. The right data line bending area 121L includes a third data line bending area 1213 and a fourth data line bending area 1214.

For the five data line bending areas divided in FIG. 11, the first fanout area 122 also include five corresponding data line fanout sub-areas, and the corresponding pair of data line fanout sub-area and the data line bending area have the same quantity of data lines and in one-to-one correspondence. In addition, based on the symmetrically arranged high voltage power lines Vdd and the symmetrically arranged low voltage power lines Vss provided in the active area 110, the bending area 121 is provided with four bending areas (i.e., 121 Vss1, 121 Vdd1, 121 Vdd2, and 121 Vss2) arranged to connect the high voltage power lines and the low voltage power lines. Based on the above structure, high voltage power lines Vdd or low voltage power lines Vss can be arranged in the middle of any two adjacent sub-areas of the five data line fanout sub-areas, i.e. the structure of the bending area 121 can be: a first data line bending area 1211, a first low voltage power line bending area 121 Vss1, a second data line bending area 1212, a first high voltage power line bending area 121 Vdd1, a central data line bending area 121C, a second high voltage power line bending area 121 Vdd2, a third data line bending area 1213, a second low voltage power line bending area 121 Vss2, and a fourth data line bending area 1214 are sequentially arranged from left to right. In addition, in the first fanout area 121 of the display panel 100 shown in FIG. 11, a first data line fanout sub-area 1221, a second data line fanout sub-area 1222, a third data line fanout sub-area 1223, and a fourth data line fanout sub-area 1224, which respectively correspond to the first data line bending area 1211, the second data line bending area 1212, the third data line bending area 1213, and the fourth data line bending area 1214, are sequentially arranged from left to right.

In practical applications, for the beauty of the display screen or user's needs, the active area 110 of the display panel is generally made into a shape with four corners being rounded chamfers. The display panel 100 shown in FIGS. 2 to 11 does not show rounded chamfers, but it can be understood that the left and right apex corners below the active area can be in a shape of rounded chamfer, the area including the left apex corner is called the left chamfered area (or the first chamfered area), and the area including the right apex corner is called the right chamfered area (or the second chamfered area). It can be understood that few data lines are longitudinally distributed in the left chamfered area and the right chamfered area, and the data lines in these areas can be connected to the corresponding data line bending areas through the corresponding left data line fanout sub-area 122L and the right data line fanout sub-area 122R, in the segmented fanout mode in FIGS. 9 to 11.

Based on the mode of fanning out data lines in segments and partitioning the bending area in the display panel 100 shown in FIGS. 9 to 11, the quantity of data lines in the left data line fanout sub-area 122L connected to the left data line bending area 121L is equal to the quantity of data lines in the left chamfered area of the active area 110, and the quantity of data lines in the right data line fanout sub-area 122R connected to the right data line bending area 121R is equal to the quantity of data lines in the right chamfered area of the active area 110. For example, as in the structure shown in FIGS. 9 and 10, the quantity of data lines in each of the left chamfered area, the right chamfered area, and the corresponding left data line bending area 121L and right data line bending area 121R is r, the quantity of data lines in the central data line bending area 121C is a, and the total quantity of data lines is a+2r. For another example, as in the structure shown in FIG. 11, the quantity of data lines in each of the left chamfered area and the right chamfered area is r, the data lines in the left chamfered area are connected in segments to the first data line bending area 1211 and the second data line bending area 1212, the data lines in the right chamfered area are connected in segments to the third data line bending area 1213 and the fourth data line bending area 1214, that is, 1211, 1212, 1213 and 1214 all have r/2 data lines, the quantity of data lines in the central data line bending area 121C is a, and the total quantity of data lines is also a+2r.

For the display panel 100 with the active area 110 including the chamfers, since the shape and area of the light-emitting pixels in the chamfered area are different from the central area of the active area 110, the data lines in the two areas (the left chamfered area and the right chamfered area) are respectively connected with the drive IC through the corresponding left data line bending area 121L and right data line bending area 121R. Thus, the drive IC can be used to compensate the brightness uniformity of the data lines in the left chamfered area and the right chamfered area to ensure better uniformity of the display brightness of the display panel 100.

Figure 12:
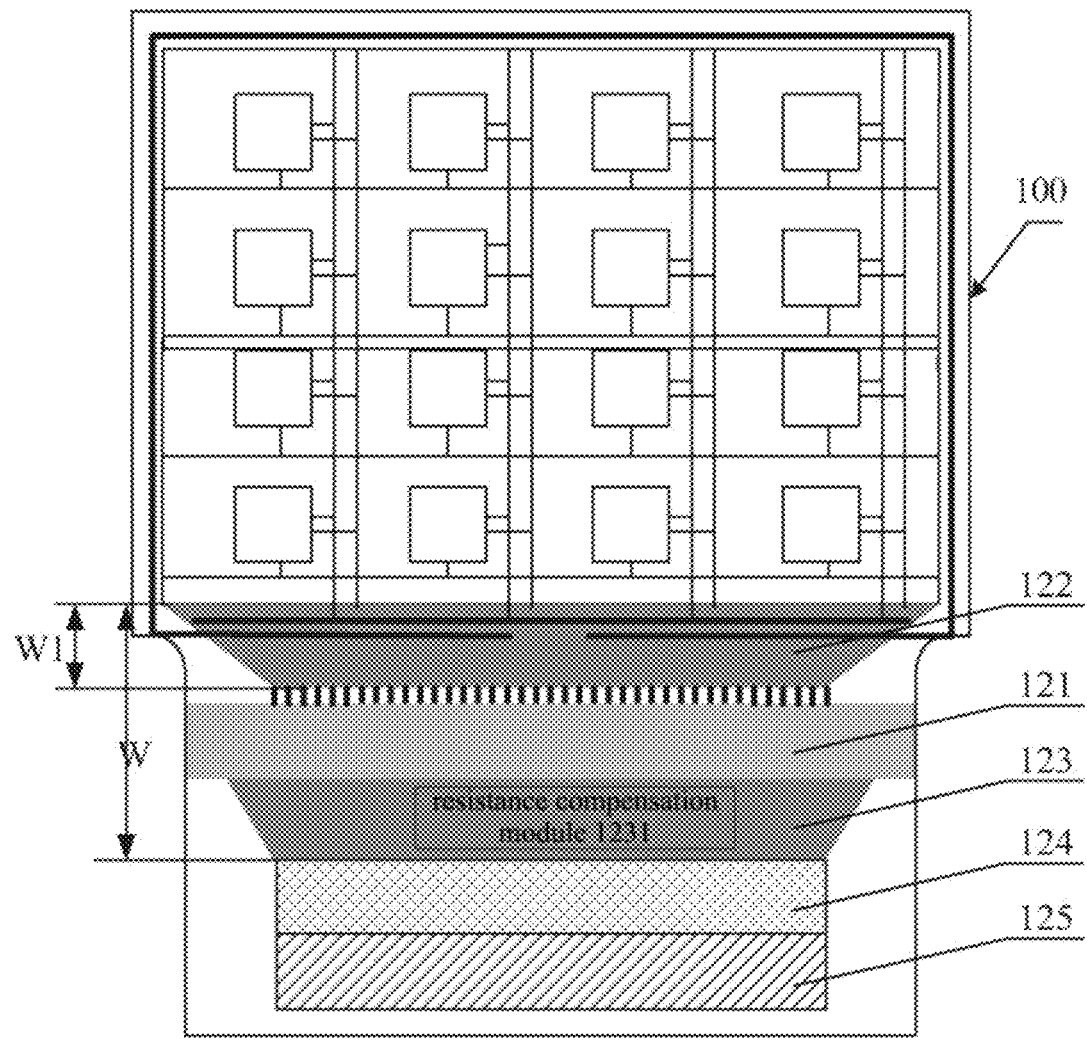
FIG. 12 is a schematic structural diagram of another display panel provided by an embodiment of the present disclosure.

FIG. 12 is a schematic structural diagram of another display panel provided by an embodiment of the present disclosure. FIG. 12 shows an example based on the structure of the display panel 100 shown in FIGS. 7 to 11, the structures of the bending area 121 and the first fanout area 122 are not shown schematically in FIG. 12, and the bending area 121 and the first fanout area 122 are shown schematically only by area reference signs. The non-active area 120 of the display panel 100 provided by the embodiment of the present disclosure may further include a second fanout area 123 bent to the non-active area 120 of the display panel 100 through the bending area 121, and the plurality of data lines extend to the second fanout area 123.

The second fanout area 123 in the embodiment of the present disclosure is configured to fan out the data lines in the bending area 121 again, and the second fanout area 123 includes a resistance compensation module 1231 configured to perform resistance compensation for the data lines connected to the first fanout area 122, so that the impedance of the data lines changes gradually. In addition, the non-active area 120 in the embodiment of the present disclosure may further include a cell test 124 connected to the second fanout area 123 and a drive IC 125 connected to the cell test 124.

In the embodiment of the present disclosure, all data lines and other wires are connected to the drive IC 125.

Referring to FIGS. 1 and 7 to 11, FIG. 1 illustrates a structure of data line fanout in a display panel, and FIGS. 7 to 11 illustrate a structure of data line fanout in the display panel provided by the embodiment of the present disclosure. It can be seen that in the display panel 20 shown in FIG. 1, a large quantity of scattered data lines 22*a* led out below the active area 21 are connected to the concentrated data line bending area 23*a*, and the data line fanout area 22 and the data line bending area 23*a* are not partitioned into segments. Therefore, the impedance of adjacent data lines 22*a* is continuous and gradually changing. In the display panel 100 provided by the embodiment of the present disclosure shown in FIG. 11, the data lines are fanned out in segments, that is, the data lines in the first fanout area 122 and the bending area 121 all have at least two sub-areas, as in the structures shown in FIGS. 7 to 11. Taking the structure shown in FIG. 11 as an example, the length of data lines connected to the same data line bending area is gradually changed, and their impedance is also gradually changed. Due to the structure of fanning out in segments and partitioning the bending area, the impedance of two adjacent data lines connected to in the adjacent data line bending areas has a sudden change. For example, 100 data lines are connected to each of the first data line bending area 1211, the second data line bending area 1212, the third data line bending area 1213, and the fourth data line bending area 1214, and the data lines are numbered consecutively. The impedance between the 100th data line in the first data line bending area 1211 and the 101st data line in the second data line bending area 1212 has a sudden change. The data lines in the above multiple data line bending areas are fanned out for the second time, and an equal resistance compensation design is made in the second fanout area 123 to make the impedance of all data lines gradually change.

In the display panel 100, the specifications of the active area 110 and the drive IC are fixed, and the structure for fanning out data lines in segments makes the overall width W of the portion from the first fanout area 122 to the second fanout area 123 become larger, and the space occupied by wiring in the first fanout area 122 become smaller (i.e., the width W1 of 122 becomes smaller). Although the overall wiring space in the second fanout area 123 connected to the drive IC 125 below the bending area 121 becomes larger, the width of the lower border of the display panel 100 is not affect, because this part of wiring is finally bent to the back of the active area 110 through the bending area 121, that is, according to the display panel 100 provided by the embodiment of the present disclosure, the lower border can be effectively reduced to achieve the goal of narrow lower border by adopting the structure of fanning out data lines in segments and partitioning in the bending area. In an exemplary embodiment, approximately the bent lower border can be reduced from 2.0 millimeters (mm) to 1.5 mm, which increases the screen-to-body ratio of the display panel 100.

In an exemplary embodiment, the display panel 100 includes a flexible display panel.

Based on the display panel 100 provided in the above embodiment of the present disclosure, the embodiment of the present disclosure also provides a display apparatus, including the display panel 100 in any of the above embodiments shown in FIGS. 2 to 12. Based on the technical effect of the display panel 100 provided in the above embodiment, the display apparatus provided in the embodiment of the present disclosure also has a structure of a narrow lower border and has a higher screen-to-body ratio.

Although embodiments of the present disclosure are described in the above, the above embodiments are described only for better understanding, rather than restricting the present disclosure. Any person skilled in the art can make any modifications and variations in the form and details of implementation without departing from the spirit and scope of the present disclosure. The protection scope of the present disclosure shall be determined by the scope as defined in the claims.

What I claim is:

1. A display panel, comprising: an active area and a non-active area located at least on one side of the active area, wherein:
    the active area is in a rectangular shape; the at least on one side of the active area comprises a first side, a second side, a third side and a fourth side, the non-active area comprises a first fanout area;
    a plurality of sub-pixels located in the active area;
    a plurality of data lines located in the active area and extending from the active area to the first fanout area, the plurality of data lines electrically connected to the plurality of sub-pixels and configured to provide data signals for the plurality of sub-pixels;
    the first fanout area comprises at least two data line fanout sub-areas, and the plurality of data lines respectively extend into the at least two data line fanout sub-areas;
    the display panel further comprises: a high voltage power line and a low voltage power line;
    the high voltage power line is located in the non-active area, at least part of the high voltage power line is located in the first fanout area, the high voltage power line is configured to transmit high voltage signals for the plurality of subpixels, and each high voltage power line comprises at least two high voltage power line pins;
    the low voltage power line is located in the non-active area, and the low voltage power line is in an circular shape with a main body of the low voltage power line surrounding the first side, second side and third side of the active area in the rectangular shape, and two ends of the low voltage power line being located at a side of the fourth side of the active area in the rectangular shape;
    the low voltage power line is configured to transmit low voltage signals for the plurality of sub-pixels, and the low voltage power line comprises at least two low voltage power line pins; and
    at least one of the at least two high voltage power line pins and the at least two low voltage power line pins is located between the at least two data line fanout sub-areas.

2. The display panel according to claim 1, wherein a quantity of the at least two data line fanout sub-areas is two, a quantity of the at least two high voltage power line pins is two, a quantity of the at least two low voltage power line pins is two, and the two high voltage power line pins and the two low voltage power line pins are all located between the two data line fanout sub-areas.

3. The display panel according to claim 1, wherein a quantity of the at least two data line fanout sub-areas is three, and at least one of the at least two high voltage power line pins and the at least two low voltage power line pins is provided between every two data line fanout sub-areas.

4. The display panel according to claim 3, wherein a quantity of the at least two high voltage power line pins is two, a quantity of the at least two low voltage power line pins is two, a quantity of the at least two data line fanout sub-areas is three, the two high voltage power line pins are respectively located between the three data line fanout sub-areas, and the two low voltage power line pins are respectively located between the three data line fanout sub-areas.

5. The display panel according to claim 1, wherein a quantity of the at least two high voltage power line pins is two, a quantity of the at least two low voltage power line pins is two, a quantity of the at least two data line fanout sub-areas is five, and the two high voltage power line pins and the two low voltage power line pins are respectively located between the five data line fanout sub-areas.

6. The display panel according to claim 5, wherein one of the two high voltage power line pins and the two low voltage power line pins is provided between every two of the five data line fanout sub-areas.

7. The display panel according to claim 1, wherein the two high voltage power line pins are symmetrically arranged with respect to a centerline of the display panel, and the two low voltage power line pins are symmetrically arranged with respect to the centerline of the display panel.

8. The display panel according to claim 1, wherein outermost two data line fanout sub-areas of the at least two data line fanout sub-areas have a same quantity of data lines.

9. The display panel according to claim 1, wherein the display panel further comprises a bending area located at a side, away from the active area, of the first fanout area, the plurality of data lines extend to the bending area, and the bending area is configured to be bent to a back side of the display panel.

10. The display panel according to claim 9, further comprising a second fanout area located at a side, away from the active area, of the bending area, and the plurality of data lines extend to the second fanout area;

the second fanout area comprises a resistance compensation module configured to perform resistance compensation for the plurality of data lines, enabling an impedance of the data lines to change gradually.

11. A display apparatus, comprising: the display panel according to claim 1.

12. A display apparatus, comprising: the display panel according to claim 2.

13. A display apparatus, comprising: the display panel according to claim 3.

14. A display apparatus, comprising: the display panel according to claim 4.

15. A display apparatus, comprising: the display panel according to claim 5.

16. A display apparatus, comprising: the display panel according to claim 6.

17. A display apparatus, comprising: the display panel according to claim 7.

18. A display apparatus, comprising: the display panel according to claim 8.

* * * * *